United States Patent [19]
Hess

[11] 4,441,766
[45] Apr. 10, 1984

[54] PROTECTIVE EQUIPMENT CABINET

[76] Inventor: Joachim Hess, Schröplerstrasse 37, D-8070 Ingolstadt, Fed. Rep. of Germany

[21] Appl. No.: 415,441

[22] Filed: Sep. 7, 1982

[30] Foreign Application Priority Data

Sep. 8, 1981 [DE] Fed. Rep. of Germany ....... 3135471

[51] Int. Cl.³ .............................................. A47B 81/00
[52] U.S. Cl. ..................................... 312/214; 312/100
[58] Field of Search ............... 62/259.1, 298; 312/100, 312/102, 214, 257 SM; 52/309.9, 309.11, 262, 265, 198, 282; 220/902, 444; 108/901

[56] References Cited

U.S. PATENT DOCUMENTS

| 2,845,321 | 7/1958 | Saunders et al. | 312/214 |
| 3,110,535 | 11/1963 | Anderson | 312/257 SK |
| 3,294,462 | 12/1966 | Kesling | 312/214 |
| 3,913,996 | 10/1975 | Benford | 220/902 |
| 4,190,305 | 2/1980 | Knight et al. | 312/214 |

FOREIGN PATENT DOCUMENTS 1103948  4/1961  Fed. Rep. of Germany ...... 312/214

Primary Examiner—William E. Lyddane
Assistant Examiner—Joseph Falk
Attorney, Agent, or Firm—Karl F. Ross; Herbert Dubno

[57] ABSTRACT

A protective cabinet has four upright and hollow polygonal-section posts formed of a fiber-reinforced polyester and spaced at corners of a rectangle. Four respective upright walls between the posts each have a rigid and rectangular inner panel, a rigid outer panel identical and parallel to the inner panel, an annular rim joining the outer edges together and projecting annularly inward past the inner panel, and a mass of insulating material between the panels and within the rim. The rim engages at its outer face between two respective posts and the panels have parallel and spaced outer edges. Respective rigid equipment-supporting channels lie inward of the inner panel against the rim on its inner face opposite each respective post. Fasteners such as screws or rivets secure the channels through the rims to the respective posts, thereby also securing the respective wall to the respective posts. The rigid channels distribute force evenly between the fasteners and the posts and walls they are securing together and they are constructed with appropriate holes and other formations so that equipment can be mounted on them.

8 Claims, 4 Drawing Figures

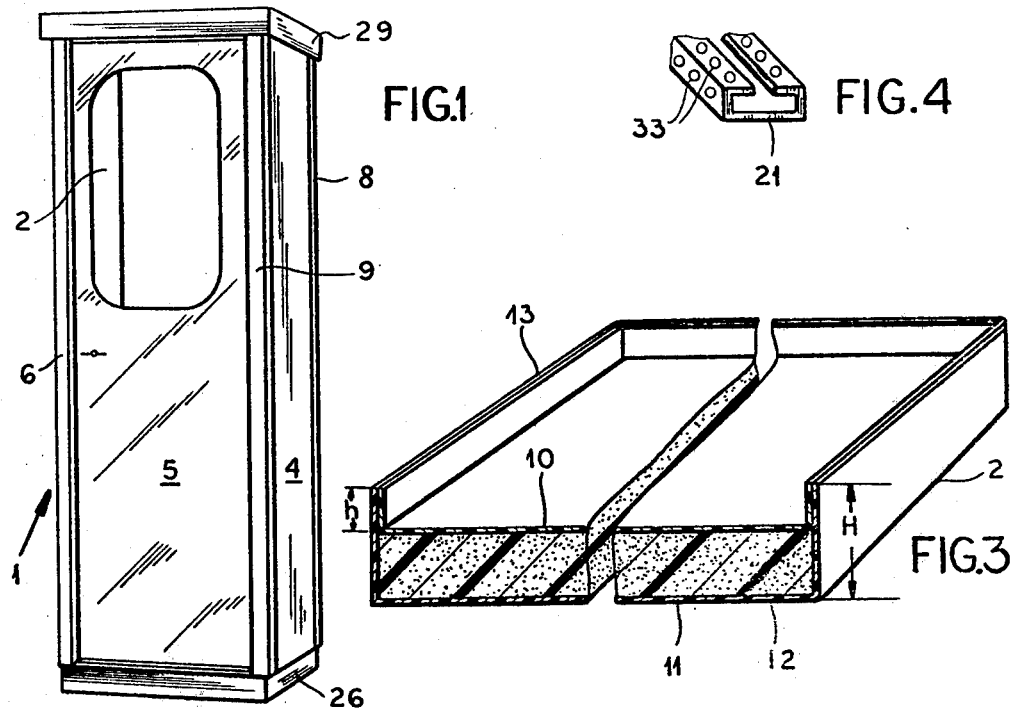
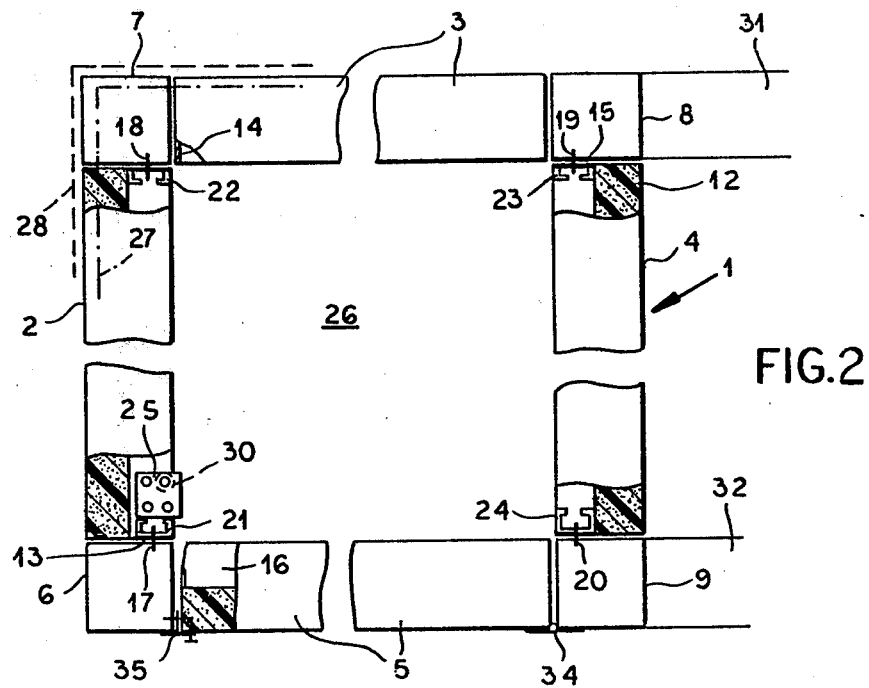

PROTECTIVE EQUIPMENT CABINET

FIELD OF THE INVENTION

The present invention relates to a protective equipment cabinet or locker. More particularly this invention concerns an enclosure in which sensitive equipment is housed to protect it from an atmosphere that could corrode or dirty it or that is too hot or cold.

BACKGROUND OF THE INVENTION

It is standard practice to provide delicate process monitoring equipment in a potentially harmful environment like an oil refinery or cracking plant in a special cabinet or locker that shields it from harmful airborne materials and sudden temperature variations. Without such protection much electronic equipment would have a very short service life.

Such a cabinet must therefore be a solid freestanding unit that can be closed tightly. Its walls must be of insulating material, and it must be provided internally with appropriate hardware for mounting the equipment to be protected. Standard rack mounting is normally employed. Thus the inner surfaces of the walls are provided with the necessary formations.

As a rule the inner and outer surfaces of the walls are formed with square teeth, making it easy to mount things on them and bond things to them. Such irregularities on both the inside and outside faces of the walls make them unattractive to start with, and cause them to trap dirt so that they rapidly become even more unattractive. At the same time, such cabinets cannot normally be allowed to get very dirty, as in the conditions they work under the foreign matter clinging to them can be highly corrosive.

When the faces of the walls of such a cabinet are of aluminum, corrosion becomes a problem in many environments encountered in industry, particular airborne salts. Nonetheless aluminum is used to impart the necessary strength to the assembly.

OBJECTS OF THE INVENTION

It is therefore an object of the present invention to provide an improved protective equipment cabinet.

Another object is the provision of such a protective equipment cabinet which overcomes the above-given disadvantages.

A further object is the provision of an insulating cabinet which stays relatively clean, yet which is easy to assemble and mount equipment in.

SUMMARY OF THE INVENTION

These objects are attained according to the instant invention in a protective cabinet having a plurality of upright and hollow polygonal-section posts formed of a rigid synthetic resin and spaced at corners of a polygon. Respective upright walls between the posts each have a rigid and polygonal inner panel, a rigid outer panel generally identical and parallel to the inner panel, an annular rim joining the outer edges together and projecting annularly inward past the inner panel, and a mass of insulating material between the panels and within the rim. The rim engages at its outer face between two respective posts and the panels have parallel and spaced outer edges. Respective rigid equipment-supporting channels lie inward of the inner panel against the rim on its inner face opposite each respective post. Fasteners secure the channels through the rims to the respective posts, thereby also securing the respective wall to the respective posts.

Thus the rigid channels serve to distribute force evenly between the fasteners and the posts and walls they are securing together. At the same time they are constructed with appropriate holes and other formations so that equipment can be mounted on them. As a result the mass of insulating material is left wholly encapsulated, not exposed through holes in either panel.

According to another feature of this invention the panels are rectangular and the posts are of square section. In addition the posts are made of a polyester resin reinforced with glass fibers. The channels themselves are of C-section. As a result the cabinet will be parallepipedal. In fact the exposed surfaces are all of smooth synthetic-resin material. As such the cabinet will be nice looking and eacy to keep clean. In addition the smooth inert surfaces will not catch dirt or be able to corrode or react with most industrial pollutants.

In accordance with another inventive feature, each of the walls has two rigid sheets with upturned edges forming the respective panels. The upturned edge of the sheet forming the outer panel is taller and forms the rim with the upturned edge of the other sheet. The insulating material is a mass of rigid foam, for instance a closed-cell foam urethane, between the sheets.

It is also possible according to this invention for the panels and rim to be formed by a rigid dense skin on a foamed synthetic-resin forming the insulating mass. Such a one-piece wall is extremely corrosion-resistant, can be produced at low cost, and is very rigid. In addition it is possible to achieve maximum insulating effect with this style of wall.

The cabinet of this invention also has a horizontal floor member underlying the walls and posts and horizontally overlapped thereby, a horizontal roof member overlying the walls and posts and horizontally overlapping same, and respective floor- and roof-mounting hardware secured to the roof and floor members and to the channels.

In order to provide ventilation for the cabinet, it has spacers between at least one of the horizontal members and the respective mounting hardware. Such spacers can be at the top or the bottom of the walls and can form a thin weather-proof slot allowing limited air circulation, if that is desired. These spacers can simply be washers between the confronting surfaces of the mounting hardware and the roof or floor member.

DESCRIPTION OF THE DRAWING

The above and other features and advantages will become more readily apparent from the following, reference being made to the accompanying drawing in which:

FIG. 1 is a perspective view of a cabinet or locker according to this invention;

FIG. 2 is a top view partly in section through the cabinet according to the invention with the roof removed;

FIG. 3 is a partly sectional perspective view through a wall according to the invention; and FIG. 4 is a large-scale perspective view of a portion of a mounting channel according to the invention.

SPECIFIC DESCRIPTION

As seen in FIG. 1 a protective cabinet 1 according to this invention has four upright walls 2-5, the wall 5 being constituted as a hinged openable door. These walls are secured together at identical corner posts 6–9. The resultant structure is parallelepipedal.

The wall 2, which is identical to the walls 3 and 4 and substantially identical to the door wall 5, is formed as shown in FIG. 3 of a rectangular inner rigid panel 10 and an identical outer rigid panel 11, both of a rigid synthetic resin. A mass 12 of rigid closed-cell foam insulation completely fills the space between them. A rim 13 unitary with the two panels 10 and 11 has a height H which exceeds by a distance h the spacing between the two panels 10 and 11 so that it projects inward of the inner panel 10. This rim 13 is annular and can in fact be formed by a lip of height H on the panel 11 and a lip of height h on the panel 10, with the two lips being joined together, such as by thermal bonding, inside the inner panel 10. The other panels 3, 4, and 5 are similarly formed with rims 14, 15, and 16.

The posts 6–9 are of hollow square section with a side dimension equal to H, and are made of a rigid polyester reinforced with glass fibers so they are very strong. The flanges or rims 13–16 are thus applied against them and secured in place by fasteners 17–20, here rivets, although self-tapping screws or the like would be equally usable. A strip of a bonding agent or adhesive is normally provided between the outer face of each rim and the post surface it is fastened to so that the joint is airtight.

In addition U-section mounting strips 21–24 are secured against the inner surfaces of the rims, and the fasteners 17–20 pass through them also. These strips are formed as seen in FIG. 4 with holes 33 that allows equipment to be bolted to them relatively easily. They are made of a very strong material such as galvanized steel to permit relatively heavy equipment to be supported from them, and can in fact be constituted for standard rack storage, that is have appropriate clips or holes to mate with standard equipment rack fittings. The C-section makes the strips 21–24 rigid against bending in every direction, permitting only limited torsional deformation, which is the one type of stress the strips will not be subjected to. Thus these strips 21–24 hold the assembly together, while providing very substantial support for even the heaviest equipment. In fact these strips combine with the fairly rigid walls to make the entire assembly rock-solid, something often fairly difficult to obtain with a nearly wholly plastics construction.

A floor panel 26 whose vertical projection is shown at 27 and a roof panel 29 whose projection is shown at 28 in FIG. 2 are secured at corner fittings 25 to the assembly. Thus the floor panel 26 is slightly smaller than the outline of the walls and the roof panel 29 is larger, so that anything falling from above will not be able to enter the cabinet 1. The fittings 25 are corner- or L-shaped and are bolted to the mounting strips 21–24, and the floor 26 and roof 29 are in turn bolted to them. Spacer washers 30 may be provided between the fittings 25 and the floor 26 and roof 29 to form a small ventilation gap at the top and bottom of each wall.

FIG. 2 further shows how further wall panels 31 and 32 can be secured to the posts 8 and 9 to increase the size of the cabinet, or to provide another cabinet next to the main one.

The door 5 is formed like the wall 2 of FIG. 3, except that its flange 16 is not bolted to the respective posts 6 and 9. Instead a hinge 34 is provided along one edge on the outer panel 11 and at the opposite vertical edge a latch 35 is provided. Appropriate seals can be provided between the flange 16 and the posts 6 and 9 to prevent leakage if necessary.

With the system of this invention it is therefore possible to erect a chemically inert and nice-looking cabinet 1 with considerable ease. Equipment can easily be bolted to the holes 33 of the stiffening strips 21–24, which members also serve for holding the fittings 25 by means of which the floor 26 and roof 29 are held in place.

I claim:

1. A protective cabinet comprising:
   a plurality of upright and hollow square-section posts formed of a rigid synthetic resin and spaced at corners of a polygon;
   respective upright walls between the posts and each having
   a rigid and rectangular inner panel,
   a rigid outer panel generally identical and parallel to the inner panel, the panels having parallel and spaced outer edges,
   an annular rim joining the outer edges together and projecting annularly inward past the inner panel, the rim engaging at its outer face at each corner between two respective posts, the panels being formed with respective upturned edges, the upturned edge of the sheet forming the outer panel being taller and forming the rim with the upturned edge of the other sheet, and
   a mass of insulating material between the panels and within the rim;
   respective rigid equipment-supporting channels at the posts and each lying inward of the respective inner panel against the rim on its inner face; and
   fasteners securing the channels through the rims to the respective posts, thereby also securing the respective wall to the respective posts.

2. The protective cabinet defined in claim 1 wherein the posts are made of a polyester resin reinforced with glass fibers.

3. The protective cabinet defined in claim 1 wherein the channels are of C-section.

4. The protective cabinet defined in claim 1 wherein the insulating material is a mass of rigid foam between the sheets.

5. The protective cabinet defined in claim 1 wherein the panels and rim are formed by a rigid dense skin on a foamed synthetic-resin forming the insulating mass.

6. The protective cabinet defined in claim 1, further comprising:
   a horizontal floor member underlying the wall panels and posts and horizontally overlapped thereby;
   a horizontal roof member overlying the wall panels and posts and horizontally overlapping same; and
   respective floor and roof mounting hardware secured to the roof and floor members and to the channels.

7. The protective cabinet defined in claim 6, further comprising:
   spacers between at least one of the horizontal members and the respective mounting hardware, whereby a ventilation space is created.

8. The protective cabinet defined in claim 1 wherein one of the walls is formed as an openable door.

* * * * *